United States Patent [19]
Lee

[11] Patent Number: 5,933,761
[45] Date of Patent: Aug. 3, 1999

[54] DUAL DAMASCENE STRUCTURE AND ITS MANUFACTURING METHOD

[76] Inventor: Ellis Lee, 5F, No. 75-1, Sec. 5, Cheng Kung Rd., Nei Hu Chui Taipei City, Taiwan

[21] Appl. No.: 09/113,879

[22] Filed: Jul. 10, 1998

Related U.S. Application Data

[62] Division of application No. 09/055,691, Apr. 6, 1998.

[30] Foreign Application Priority Data

Feb. 9, 1998 [TW] Taiwan .................................. 87101688

[51] Int. Cl.$^6$ .................................................. H01L 21/477
[52] U.S. Cl. ........................ 438/783; 438/191; 438/950; 438/787
[58] Field of Search .................................... 438/622, 624, 438/407, 440, 766, 791, 775, 724, 638, 634, 637, 950, 736, 671, 551, 373, 738, 519, 787, 783

[56] References Cited

U.S. PATENT DOCUMENTS

| | | | |
|---|---|---|---|
| 3,622,382 | 11/1971 | Brack et al. | 117/201 |
| 4,465,705 | 8/1984 | Ishihara et al. | 427/38 |
| 4,789,648 | 12/1988 | Chow et al. | 438/225 |
| 4,925,805 | 5/1990 | Van Ommen et al. | 438/21 |
| 4,968,636 | 11/1990 | Sugawara | 438/24 |
| 5,091,763 | 2/1992 | Sanchez | 357/23.9 |
| 5,314,843 | 5/1994 | Yu et al. | 438/225 |
| 5,316,965 | 5/1994 | Philipossian et al. | 438/70 |
| 5,324,680 | 6/1994 | Lee et al. | 438/52 |
| 5,429,955 | 7/1995 | Joyner et al. | 438/26 |
| 5,578,523 | 11/1996 | Fiordalice et al. | 438/190 |
| 5,672,531 | 9/1997 | Gardner et al. | 438/44 |
| 5,677,224 | 10/1997 | Kadosh et al. | 438/57 |
| 5,712,185 | 1/1998 | Tsai et al. | 438/67 |
| 5,741,626 | 4/1998 | Jain et al. | 430/314 |
| 5,796,133 | 8/1998 | Kwon et al. | 257/295 |

*Primary Examiner*—Olik Chaudhuri
*Assistant Examiner*—Kurt Eaton
*Attorney, Agent, or Firm*—Knobbe, Martens, Olson & Bear LLP

[57] ABSTRACT

The present invention relates to a dual damascene structure and its manufacturing method. The invention uses two implanting step to form two stop layers. It uses the stop layers to perform an anisotropic etching step so as to form a via and trench. Finally, a conductive layer is filled into the via and trench followed by the completion of forming of the dual damascene structure. The invention controls the etching stop. Another advantage of the present invention is that of using the spacer as the trench mask instead of the multi-mask. Therefore, misalignment is prevented in the present invention.

42 Claims, 9 Drawing Sheets

DUAL DAMASCENE STRUCTURE AND ITS MANUFACTURING METHOD

CROSS-REFERENCE TO RELATED APPLICATION

This is a divisional application of U.S. application Ser. No. 09/055,691, filed on Apr. 6, 1998, which claims the priority benefit of Taiwan application Ser. No. 87101688, filed Feb. 9, 1998, the full disclosure of which is incorporated herein by reference.

BACKGROUND OF THE INVENTION

1. Field of the Invention

This invention relates in general to a semiconductor component and its manufacturing method, and more particularly to a multi-level metallization and interconnection component and its manufacturing method.

2. Description of the Related Art

As the level of integration for integrated circuits increases, the number of interconnects necessary for linking up devices increases, too. Therefore, design employing two or more metallic layers is gradually becoming the norm in the fabrication of integrated circuits. When the level of integration is further increased a high production yield and good reliability is difficult to get. Damascene processing method is a fabrication technique that involves the creation of interconnect lines by first etching a trench in a planar dielectric layer, and then filling that trench with metal. The method is capable of introducing copper metal which is not easily etched into the semiconductor device. Therefore, this method is the best choice in the manufacturing industry for sub-quarter micron interconnects.

Conventional damascene processing technique has a number of problems. For example, depth of trench lines is hard to control, profile of via sidewall is difficult to standardize and the processing window is quite narrow.

Figure 1A:
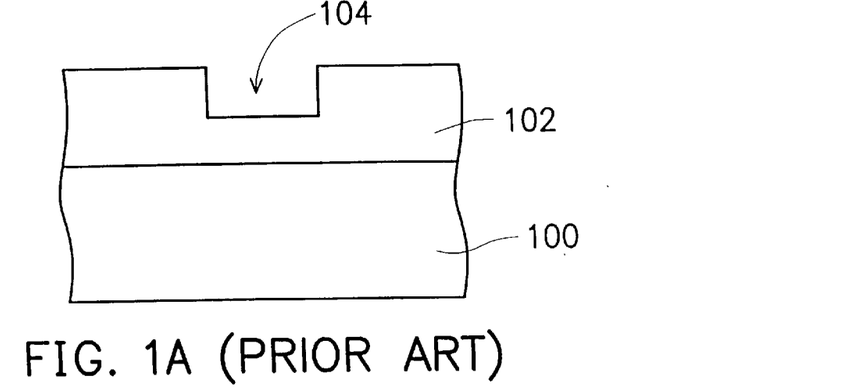
FIG. 1A to FIG. 1D (prior art) are cross-sectional views showing the manufacturing steps of a conventional dual damascene processing method.

FIG. 1A to FIG. 1D are cross-sectional views showing the manufacturing steps of a conventional dual damascene processing method. As shown in FIG. 1A, an insulator layer 102 is deposited over a semiconductor substrate 100. Then, a mask is used to define the pattern of the interconnection on the insulator layer 102. An etching process is carried out for forming a trench 104 in the insulator layer 102.

Figure 1B:
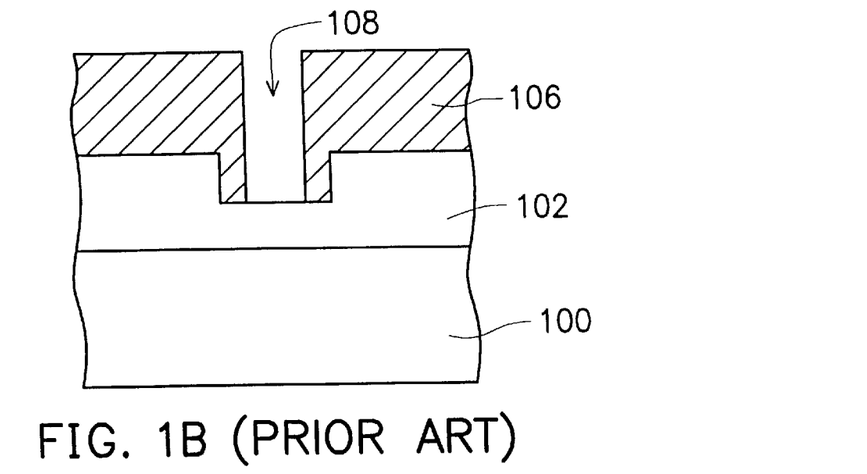

Next, referring to FIG. 1B, a thick photoresist layer 106 is formed over the insulator layer 102, filling in the trench 104. Defining and etching processes are then performed to expose the surface of the insulator layer 102 in the trench 104 so as to form a first via 108.

Figure 1C:
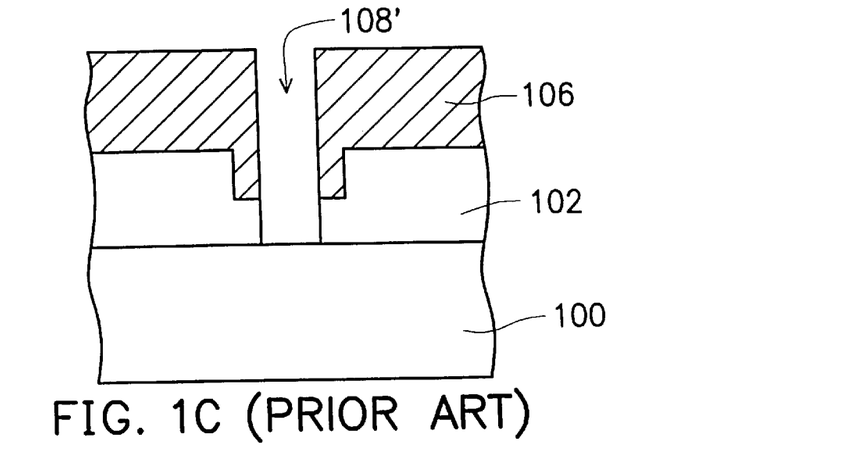

Then, as shown in FIG. 1C, an etching process is performed to remove parts of the insulator layer 102 exposed in the first via 108 and to form a second via 108', exposing the semiconductor substrate 100.

Figure 1D:
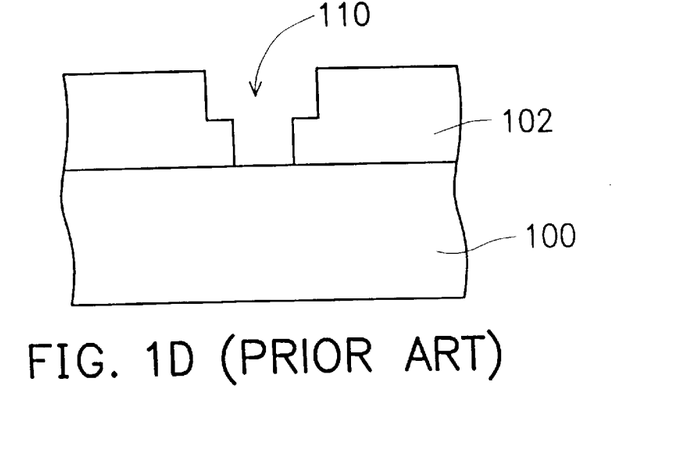

Next, the photoresist layer 106 is removed as shown in FIG. 1D so as to form a third via 110 with two different widths. A conductive layer (not shown) is formed over the entire structure; thereafter a polishing process is performed to remove the conductive layer over the insulator layer 102. This completes the forming of the dual damascene structure.

The method of manufacturing the dual damascene according the conventional method described above is not without flaws. After the trench is formed, it is necessary to perform a photolithography step for forming the first via. And, the width of the first via is smaller than the trench, therefore misalignment of the pattern occurres during the defining procedure. Furthermore, it is difficult to etch and form the via owing to the larger aspect ratio of the second via.

Figure 2A:
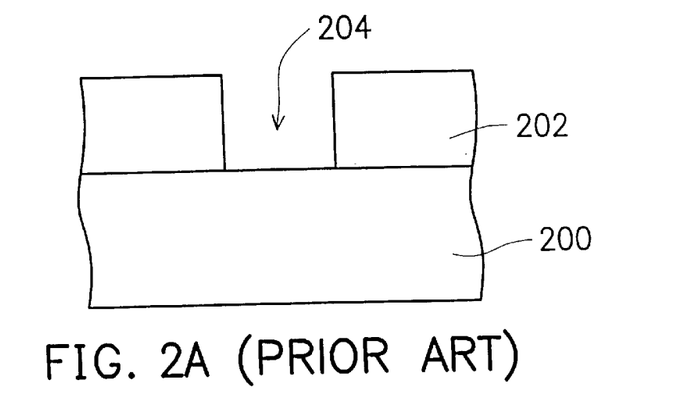
FIG. 2A to FIG. 2E (prior art) are cross-sectional views showing the manufacturing steps of another conventional dual damascene processing method.

FIG. 2A to FIG. 2E are cross-sectional views showing the manufacturing steps of another conventional dual damascene processing method. As shown in FIG. 2A, an insulator layer 202 is deposited over a semiconductor substrate 200. Then, a mask is used to define the pattern of the interconnection on the insulator layer 202. An etching process is carried out to form a trench 204 within the insulator layer 202 and expose the surface of the semiconductor substrate 200.

Figure 2B:
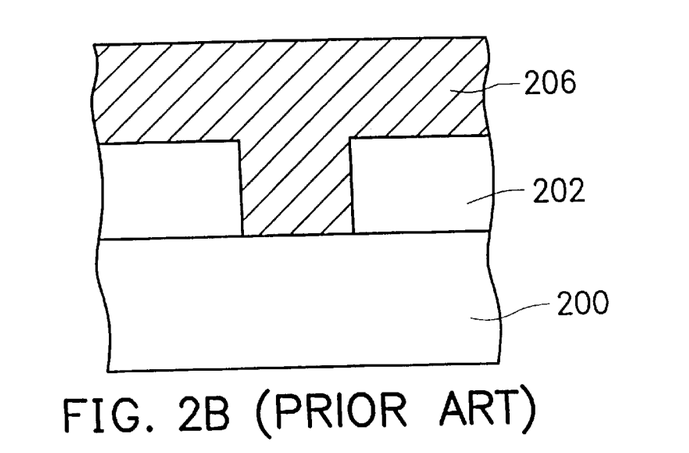
Figure 2C:
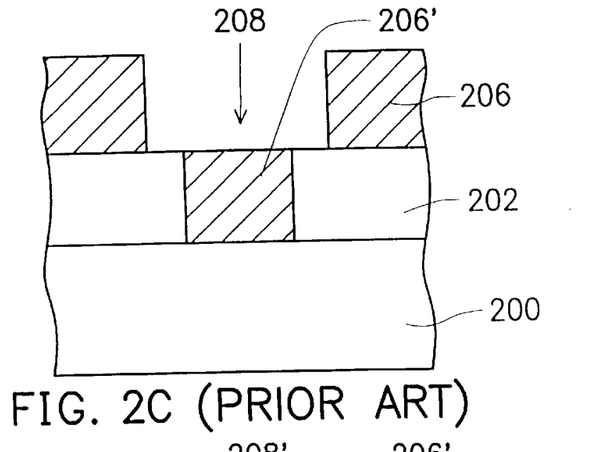

Next, referring to FIG. 2B, a layer of photoresist 206 is formed over the insulator layer 202, filling the via 204. Then, as shown in FIG. 2C, a mask is used to define the pattern of the trench 208 within the photoresist layer 206, and the undesired photoresist 206 is removed to expose parts of the insulator layer 202. The photoresist plug 206' remains in the via 204. The width of the trench 208 is larger than the via 204.

Figure 2D:
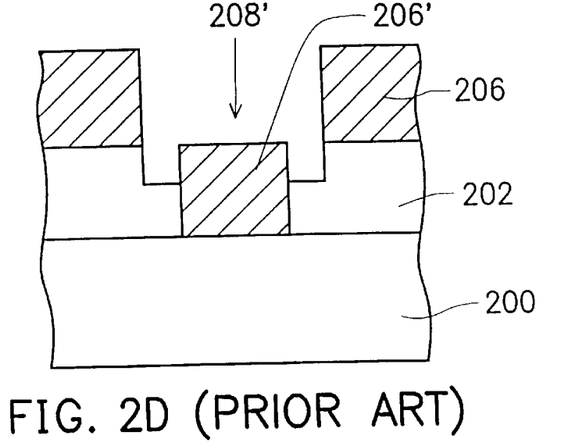

Referring to FIG. 2D, an etching step is then performed on the insulator layer 202 so as to form a trench 208' by using the trench pattern 208 within the photoresist layer 206.

Figure 2E:
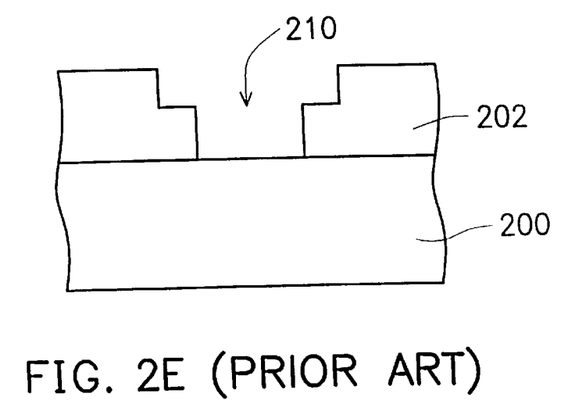

Next, as shown in FIG. 2E, the photoresist layer 206 and photoresist plug 206' are removed. A conductive layer (not shown) is formed on the entire structure; thereafter a polishing process is performed to remove the conductive layer over the insulator layer 202. This completes the forming of the dual damascene structure.

The method described above still has drawbacks. For example, there is no etching stop layer within the insulator layer, therefore it may be over-etched during the trench etching operation. As the level of integration for integrated circuits increases, it is harder and harder to remove the photoresist plug within the via. Furthermore, this method also uses several photolithographic and etching steps which are accompanied by misalignment during the via and trench formation procedures.

SUMMARY OF THE INVENTION

It is therefore an object of the invention to provide a dual damascene structure and its manufacturing method which uses a nitrogen implantation step to form an etch stop layer. The present invention improves the control of the etching stop during the etching process which is used to form the trench. In addition, the polysilicon or silicon nitride layer is used as masks for reducing misalignment during the step forming of the via and trench.

The invention achieves the above-identified objects by providing a new method of forming a dual damascene structure. A dielectric layer is formed above a semiconductor substrate. A patterned mask layer is formed on the dielectric layer. A first implanting step is performed to implant nitrogen gases or ions and a thermal annealing step is then performed so as to form a first etching stop layer in the dielectric layer. The first etching stop layer has a via opening at the position corresponding to the mask layer. A patterned photoresist layer is formed. Then, a spacer is formed on the sidewall of the photoresist layer and the spacer layer under the photoresist layer remains. A second implanting step is performed to form a second etching stop layer on the dielectric layer; the second etching stop layer has a trench opening. Thereafter, the spacer layer, spacer, and mask layer are removed. Parts of the dielectric layer are removed to form the trench and via by using an anisotropic etching step. A conductive layer is formed in the trench and via so as to form the dual damascene structure coupled to the semiconductor substrate.

The invention achieves the above-identified objects by providing another new method of forming a dual damascene structure. A dielectric layer is formed above the semiconductor substrate. A mask layer having an opening is formed on the dielectric layer. A spacer is formed on the sidewall of the opening. An implanting stop layer is formed in the dielectric layer by performing a first implanting step to implant nitrogen ions. The implanting stop layer is formed at the position corresponding to the opening formed by the spacer. The spacer is removed, and another trench opening is formed in the mask layer. A second implanting step is performed to form an etching stop layer in the dielectric layer. The etching stop layer is formed at the position corresponding to the opening on the mask layer. A third implanting step is performed to reduce the anti-implantation ability of the implanting stop layer. The implanting stop layer is transformed into an incohesive structure or oxide-like structure. Then, an anisotropic etching step is performed to form a trench and via. The via exposes the semiconductor substrate. Finally, a conductive layer is formed in the trench and via. This completes the formation of the dual damascene structure.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 3A to 3I are cross-sectional views showing the process steps of one preferred embodiment of the method for manufacturing the dual damascene.

Figure 3A:
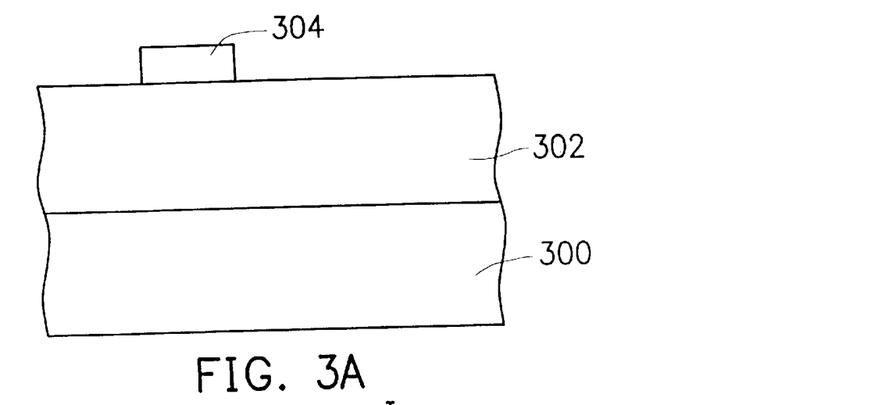
FIGS. 3A to 3I are cross-sectional views showing the process steps of one preferred embodiment of the method for manufacturing the dual damascene.

Referring to FIG. 3A, a dielectric layer 302 is formed on a semiconductor substrate 300. There are many devices formed on the substrate, but they are not shown in order to simplify the figures. The dielectric layer 302, for example, is a silicon dioxide or borophosphosilicate glass layer, with a thickness of about 20000 Å. A layer of mask 304 is then formed on the dielectric layer 302.

Figure 3B:
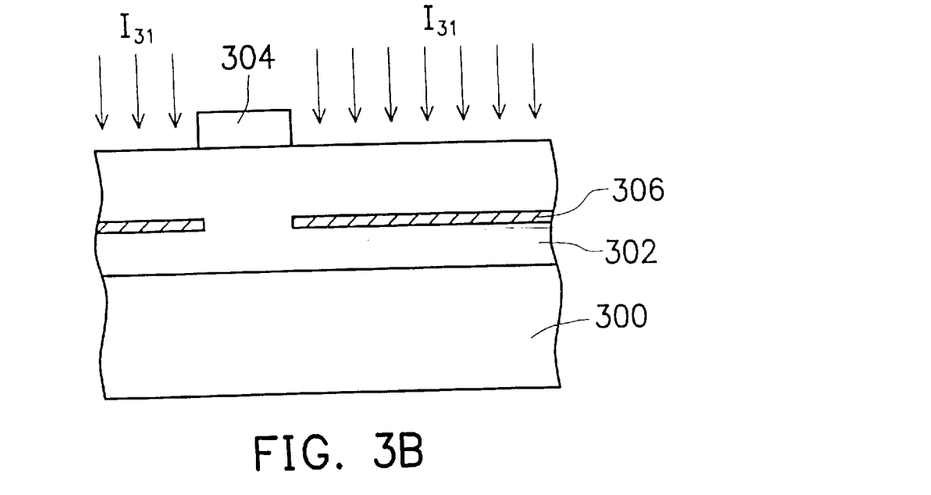

Next, referring to FIG. 3B, a first implanting step $I_{31}$ is performed to implant reactants, for example, nitrogen gases or ions, into dielectric layer 302 by using the mask layer 304. Then, an annealing step at a temperature of about 350–450° C. is performed to form a first etching stop layer 306, for example, a silicon nitride layer, at a depth of about 9000–10000 Å. The range of the annealing temperature is controlled so it does not affect the diffusion of the implants. The U.S. Pat. No. 5,314,843 discloses an implanting method regarding control of the implanting energy to implant reactants into the determined depth with a determined concentration.

Figure 3C:
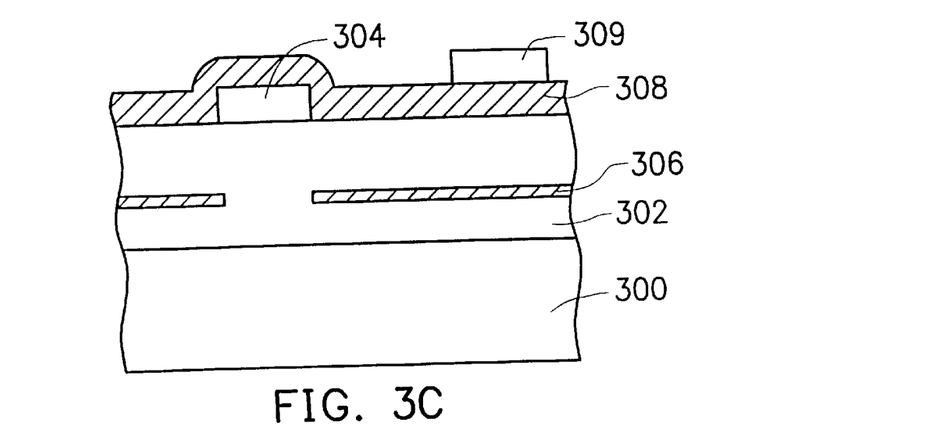

Thereafter, referring to FIG. 3C, after the first etching stop layer 306 is formed, a layer of spacer 308, for example, titanium nitride or polysilicon spacer, is formed, for example, by chemical vapor deposition method, over the dielectric layer 302 and the mask layer 304. Then, a layer of photoresist 309 is formed over the spacer 308.

Figure 3D:
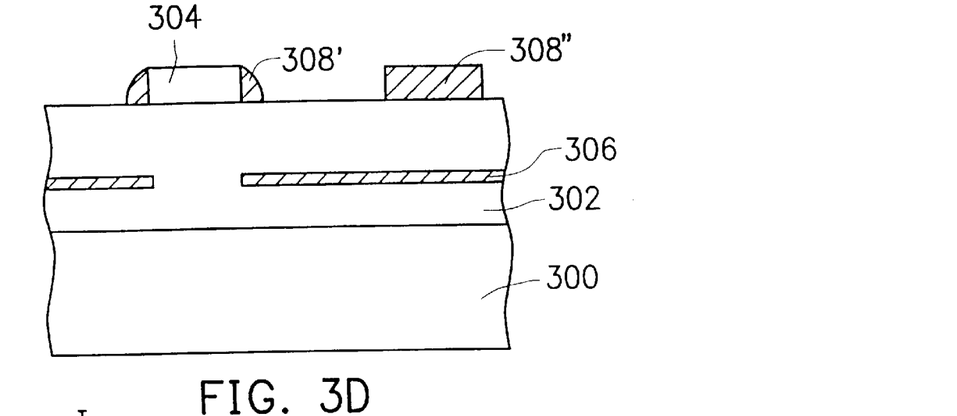

Next, referring to FIG. 3D, parts of the spacer layer 308 and photoresist layer 309 are removed until the top surface of the mask layer 304 is exposed so as to form a spacer 308' on the sidewall of the mask 304 and to leave a spacer 308" under the second photoresist layer 309. The first photoresist layer 304, spacer 308', and spacer 308" constitute a trench mask.

Figure 3E:
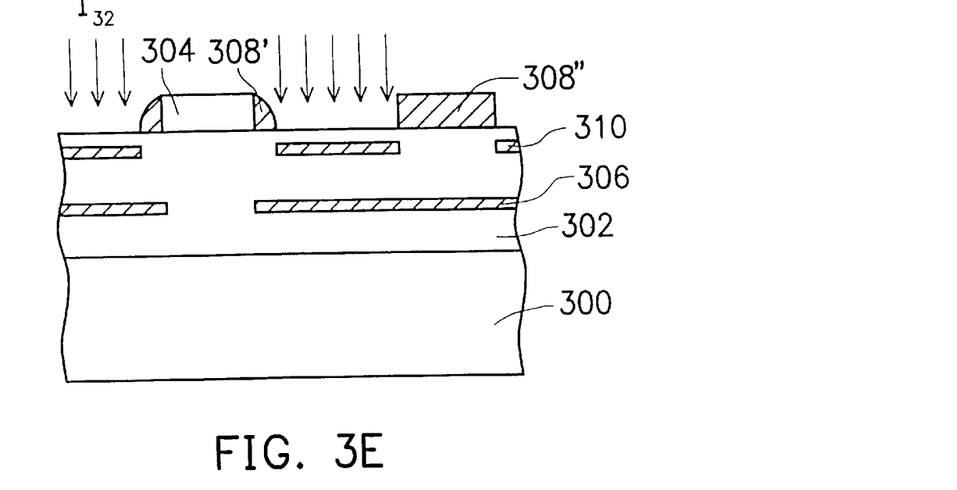

As shown in FIG. 3E, a second implanting is performed to implant reactants, for example, nitrogen ions, into the dielectric layer 302. Then, an annealing step at a temperature of about 350–450° is performed to form a second etching stop layer 310, for example, a silicon nitride layer, with the depth of about 1000–2000 Å by using the trench mask. Referring again to the U.S. Pat. No. 5,314,843, an implanting method is disclosed regarding control of the implanting energy to implant reactants into the determined depth at a determined concentration.

Figure 3F:
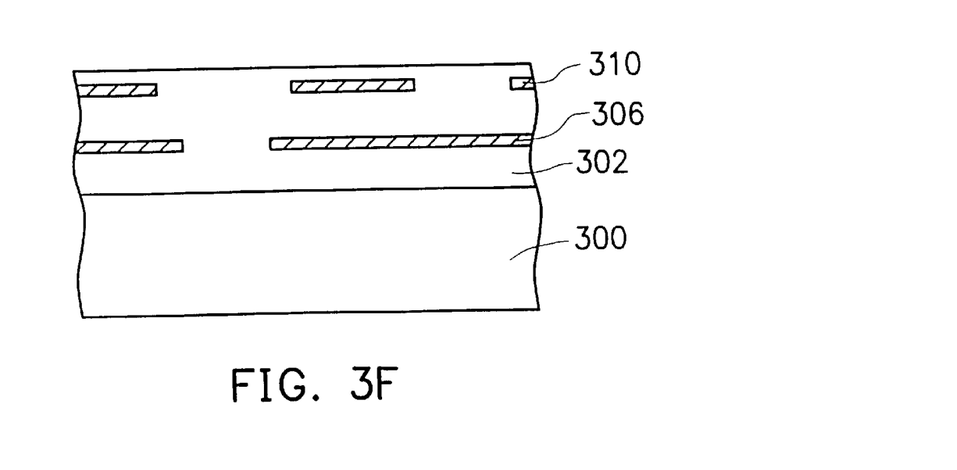

Next, referring to FIG. 3F, the trench mask is removed. The first etching stop layer 306 and second etching stop layer 310 are formed within the dielectric layer 302. The first etching stop layer 306 has an opening which is used to form a via, and the second etching stop layer 310 has an opening which is used to form a trench. The size of the opening in the first etching stop layer 306 corresponds to the mask layer 304, and the size of the opening in the second etching stop layer 310 corresponds to the size of the opening in the trench mask. Therefore the size of the trench is larger than the via.

Figure 3G:
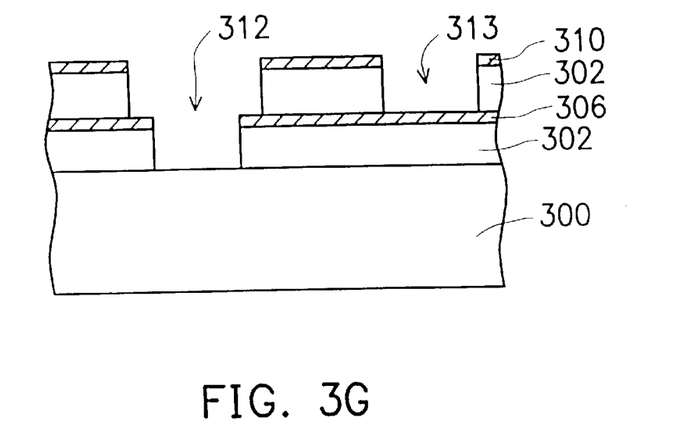

Referring to FIG. 3G, parts of the dielectric layer 302 are removed, for example, by using an anisotropic etching method and using the first and second etching stop layers 306 and 310 as stop layers for protecting the underneath dielectric layer 302 from etching. Furthermore, the first and second etching layer 306 and 310 have openings; therefore the trench/via 312 and trench 313 are formed during the etching process. Additionally, the substrate is exposed by the via 312.

Figure 3H:
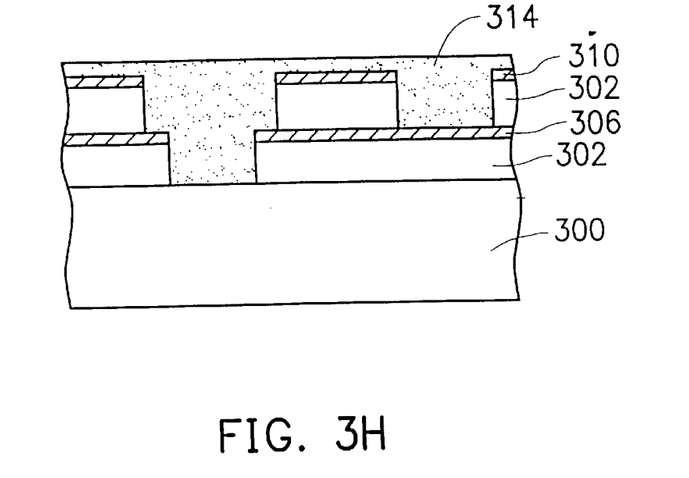

Next, referring to FIG. 3H, a conductive layer 314 is formed over the structure illustrated in FIG. 3G. The conductive layer 314 is made of metal, for example, copper, aluminum, aluminum alloy or aluminum-copper alloy.

Figure 3I:
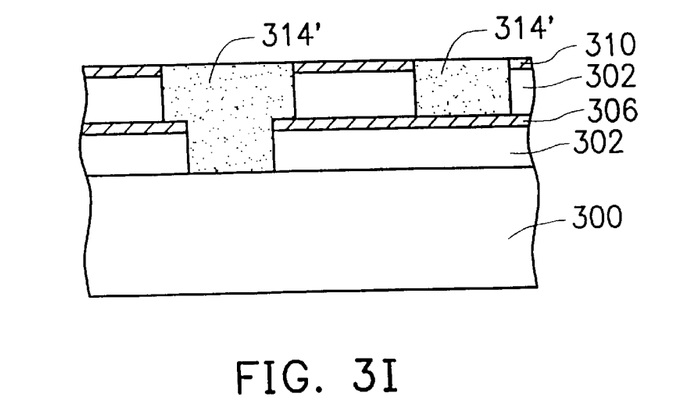

Referring to FIG. 3I, the conductive layer 314 over the second etching stop layer 310 is removed, for example, by chemical mechanical polishing method, so as to form an interconnect structure 314' in the trench/via 312 and trench 313. This completes the forming of the dual damascene structure.

FIGS. 4A to 4G are cross-sectional views showing the process steps of another preferred embodiment of the method for manufacturing the dual damascene.

Figure 4A:
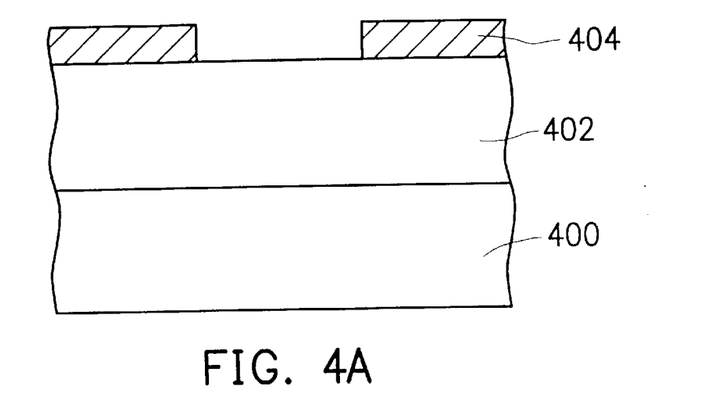
FIGS. 4A to 4G are cross-sectional views showing the process steps of another preferred embodiment of the method for manufacturing the dual damascene.

First, referring to FIG. 4A, a dielectric layer 402 is formed on a semiconductor substrate 400. There are many devices formed on the substrate, but they are not shown in order to simplify the figures. The dielectric layer 402 is, for example, a silicon dioxide or borophosphosilicate glass layer, with a thickness of about 20000 Å. A layer of mask 404 with an opening is formed on the dielectric layer 402.

Figure 4B:
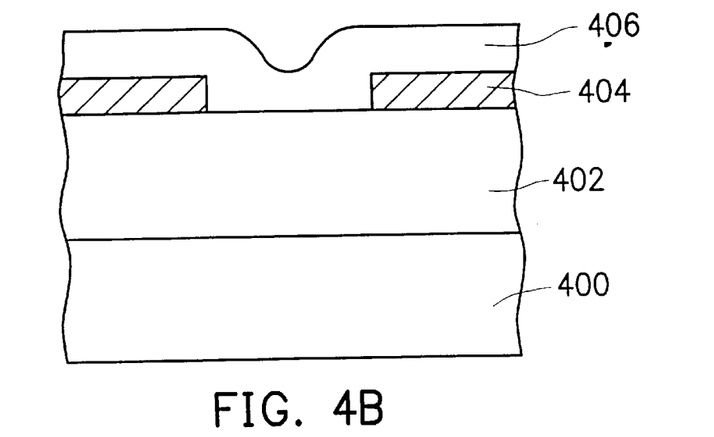

Next, referring to FIG. 4B, a layer of spacer 406, for example, titanium nitride or polysilicon, is formed, for example, by using a chemical vapor deposition method, over the structure illustrated in FIG. 4A.

Figure 4C:
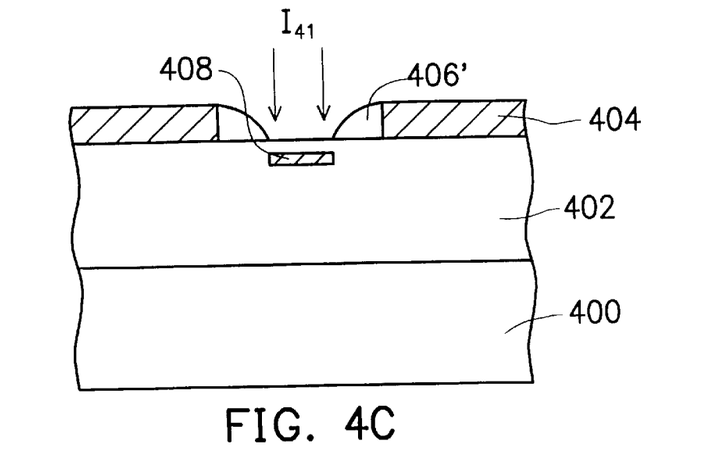

As shown in FIG. 4C, parts of the spacer 406 are removed, for example, by using an etching back method, to form a spacer 406' on the sidewall of the mask layer 404 in the opening. Then, a first implanting step $I_{41}$ is performed for implanting reactants, for example, nitrogen ions, into the dielectric layer 402 to form a implanting stop layer 408, for example, a silicon nitride layer, with a depth of about 1000–2000 Å by using the mask layer 404 and spacer 406'. The U.S. Pat. No. 5,314,843 discloses an implanting method regarding control of the implanting energy to implant reactants into the determined depth at a determined concentration. The size of the implanting stop layer 408 is the same as the opening formed in the spacer 406' and mask layer 404.

Figure 4D:
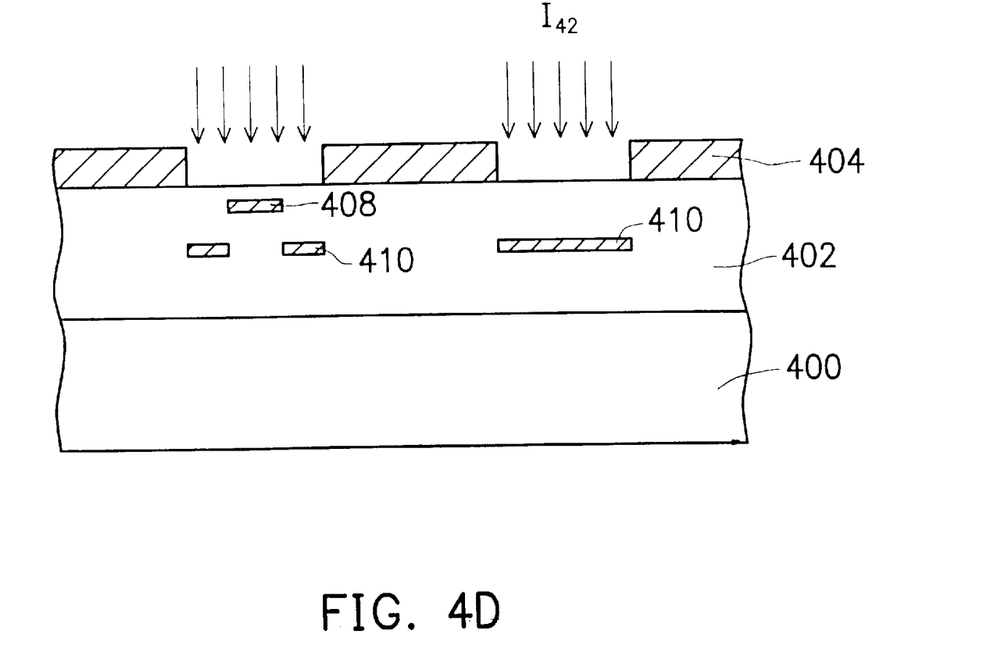

Next, referring to FIG. 4D, the spacer 406' is removed and then an another defining step is performed to form a trench opening in the mask layer 406'. A second implanting process $I_{42}$ is performed to implant reactants, for example, nitrogen ions, into the dielectric layer 402. Then, an annealing process with a higher temperature is performed to form an etching stop layer 410, for example, a silicon nitride layer, with a depth of about 9000–10000 Å. Referring again to the U.S. Pat. No. 5,314,843, it discloses an implanting method regarding control of the implanting energy to implant reactants at a determined depth with a determined concentration. Because the implanting stop layer 408 and mask layer 404 can be used as barrier layers during the second implanting process $I_{42}$, the etching stop layer 410 is not formed behind the implanting stop layer 408 and mask layer 404.

Figure 4E:
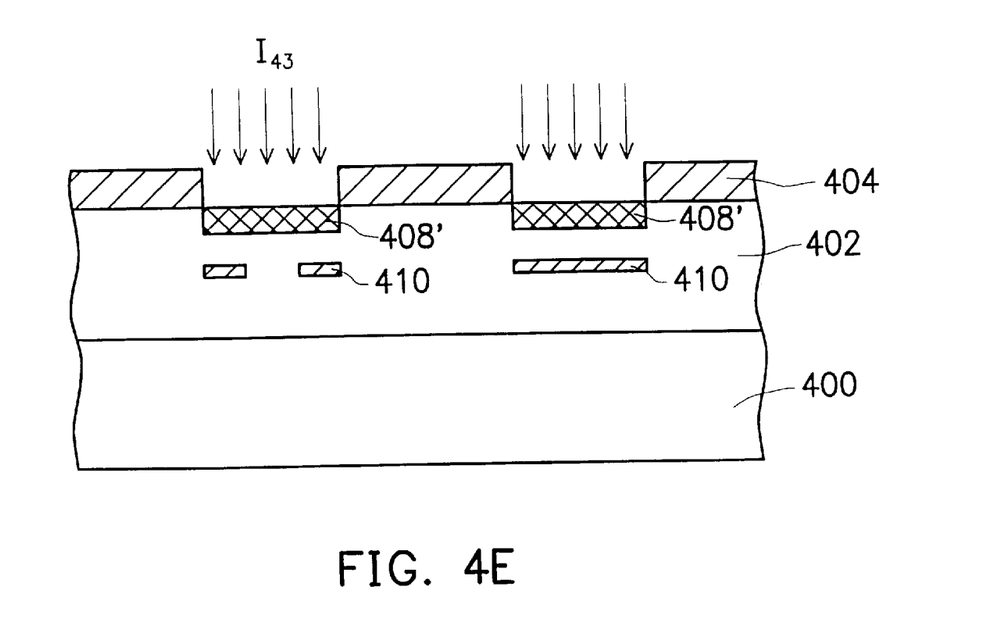

Then, referring to FIG. 4E, a third implanting step $I_{43}$ is performed to transform the implanting stop layer 408 into an incohesive structure 408', for example, by implanting oxygen gases into the implanting stop layer 408 without performing the high temperature annealing step, but so that a dielectric layer 402-like layer is formed during the high temperature annealing step. This third implanting step $I_{43}$ destroys the crystal of the silicon nitride or reduces the silicon nitride layer into the oxide-like structure. It therefore undoes the barrier ability of the implanting stop layer 408.

Figure 4F:
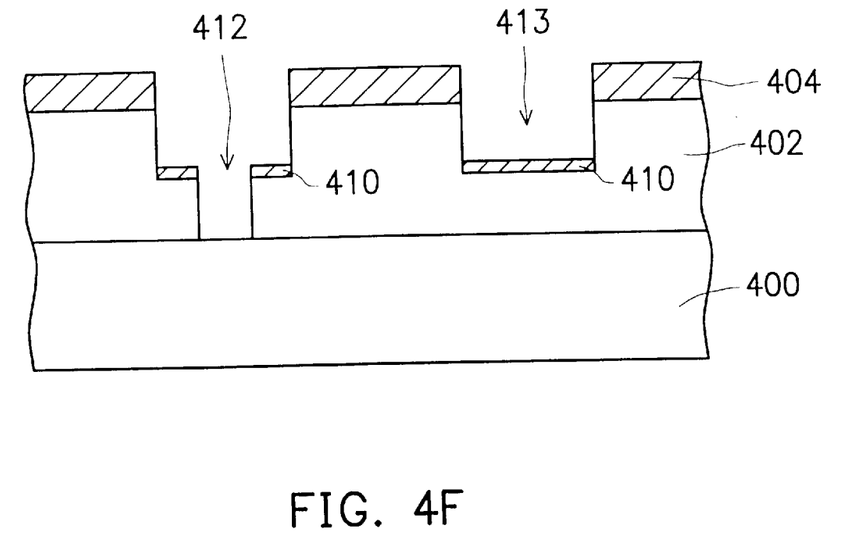

Thereafter, referring to FIG. 4F, parts of the dielectric layer 402 are removed, for example, by using an anisotropic etching method, so as to exposes the semiconductor substrate 400 by using the mask layer 404 and etching stop layer 410 as barrier layers. Therefore, the dielectric layer 402 under the mask layer 404 and etching stop layer 410 aren't be removed, and finally a trench/via 412 and a trench 413 are formed.

Figure 4G:
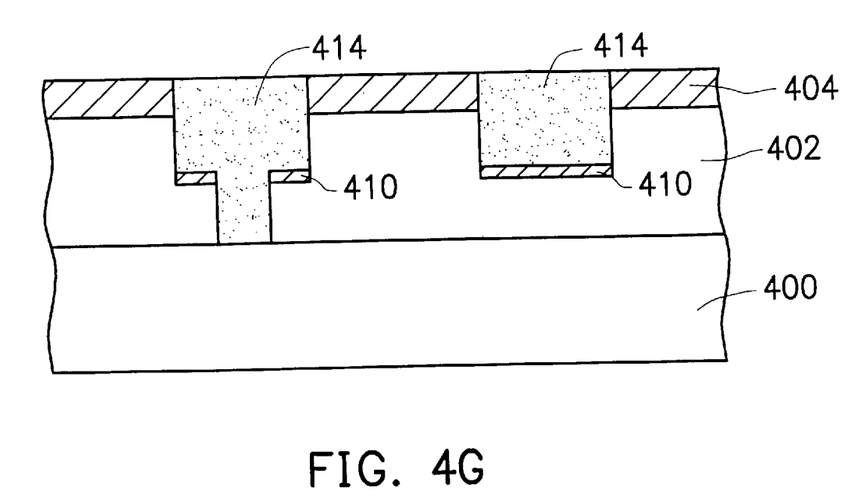

Next, as shown in FIG. 4G, a conductive layer, for example, a metal layer, is formed over the structure as shown in FIG. 4F. The material used for the conductive layer can be copper, aluminum, aluminum alloy or aluminum-copper alloy. The conductive layer over the mask layer 404 is removed, for example, by using a chemical mechanical polishing method, to form an interconnection structure 414 in the trench/via 412 and trench 413. This completes the forming of the dual damascene structure.

The characteristic of the present invention includes using two implanting step to form the two etching stop layer within the dielectric layer. The invention does not have difficulty in controlling the etching stop, as does the prior art.

Another characteristic of the present invention is that of providing a dual damascene structure and its manufacturing method. The present invention uses the spacer as the trench mask, but two mask are used in the prior art. The misalignment of the conventional method doesn't occurred in the present invention.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a dual damascene structure, comprising the steps of:

providing a semiconductor substrate;

forming a dielectric layer above the semiconductor substrate;

forming a patterned mask layer on the dielectric layer;

performing a first implanting step to form a first etching stop layer in the dielectric layer, the first etching stop layer having a via opening;

forming a spacer layer on the mask layer;

forming a patterned photoresist layer on the spacer layer;

removing parts of the photoresist and spacer layer so as to form a spacer on the sidewall of the mask layer and to leave the spacer layer under the photoresist layer;

performing a second implanting step to form a second etching stop layer on the dielectric layer, the second etching stop layer having a trench opening;

removing the spacer layer, spacer, and mask layer;

removing parts of the dielectric layer to expose parts of the semiconductor substrate, first etching stop layer and second etching stop layer;

forming a conductive layer on the semiconductor substrate, first etching stop layer and second etching stop layer; and removing the conductive layer above the second etching stop layer so as to form the dual damascene structure.

2. A method according to claim 1, wherein the thickness of the dielectric layer is about 20000 Å.

3. A method according to claim 1, wherein the dielectric layer comprises silicon dioxide.

4. A method according to claim 1, wherein the dielectric layer comprises borophosphosilicate glass.

5. A method according to claim 1, wherein the dielectric layer comprises low dielectric materials.

6. A method according to claim 1, wherein the first etching stop layer is formed in the dielectric layer with a depth of about 10000 Å down from the surface of the semiconductor substrate.

7. A method according to claim 1, wherein the first etching stop layer is a silicon nitride layer.

8. A method according to claim 7, wherein the silicon nitride layer is formed by implanting reactants into the dielectric layer and performing an annealing step.

9. A method according to claim 8, wherein the reactants comprise nitrogen/nitrogen ions.

10. A method according to claim 8, wherein the temperature of the annealing step is about 350–450° C.

11. A method according to claim 1, wherein the second etching stop is higher than the first etching stop layer, at about 8000 Å.

12. A method according to claim 1, wherein the second etching stop layer is a silicon nitride layer.

13. A method according to claim 12, wherein the silicon nitride layer is formed by implanting reactants into the dielectric layer.

14. A method according to claim 13, wherein the reactants comprise nitrogen/nitrogen ions.

15. A method according to claim 13, wherein the temperature of the annealing step is about 350–450° C.

16. A method according to claim 1, wherein the spacer comprises polysilicon.

17. A method according to claim 1, wherein the spacer comprises titanium nitride.

18. A method according to claim 1, wherein the mask layer and parts of the spacer layer removing step comprise using an etching back method.

19. A method according to claim 1, wherein the second etching stop layer is removed using a chemical mechanical polishing method.

20. A method of forming a dual damascene structure, comprising the steps of:

providing a semiconductor substrate;

forming a dielectric layer above the semiconductor substrate;

forming a mask layer having a first opening on the dielectric layer;

forming a spacer on the sidewall of the first opening;

performing a first implanting step to form an implanting stop layer in the dielectric layer with a first depth away from the top surface of the dielectric layer;

removing the spacer, and defining a second opening in the mask layer;

performing a second implanting step to form an etching stop layer in the dielectric layer with a second depth away from the top surface of the dielectric layer;

performing a third implanting step to reduce the anti-implantation ability of the implanting stop layer;

removing parts of the dielectric to form a trench and a via, the via exposing the semiconductor substrate;

forming a conductive layer in the trench and via, and on the dielectric layer; and removing the conductive layer and the mask layer on the dielectric layer.

21. A method according to claim 20, wherein the dielectric layer comprises silicon dioxide.

22. A method according to claim 20, wherein the dielectric layer comprises borophosphosilicate glass.

23. A method according to claim 20, wherein the dielectric layer comprises low dielectric materials.

24. A method according to claim 20, wherein the spacer forming step comprises the following substeps:

forming a spacer layer on the semiconductor substrate; and removing parts of the spacer layer to form the spacer on the sidewall of the opening.

25. A method according to claim 24, wherein the spacer layer comprises polysilicon.

26. A method according to claim 24, wherein the spacer layer comprises titanium nitride.

27. A method according to claim 24, wherein the parts of the spacer layer removing step comprise using an etching back method.

28. A method according to claim 20, wherein the implanting stop layer comprises silicon nitride.

29. A method according to claim 28, wherein the silicon nitride layer is formed by implanting reactants into the dielectric layer and performing an annealing step.

30. A method according to claim 29, wherein the reactants comprise nitrogen/nitrogen ions.

31. A method according to claim 30, wherein the temperature of the annealing step is about 350–450° C.

32. A method according to claim 20, wherein the second etching stop layer is a silicon nitride layer.

33. A method according to claim 32, wherein the silicon nitride layer is formed by implanting reactants into the dielectric layer and performing an annealing step.

34. A method according to claim 33, wherein the reactants comprise nitrogen/nitrogen ions.

35. A method according to claim 33, wherein the temperature of the annealing step is about 350–450° C.

36. A method according to claim 20, wherein the first depth is less than the second depth.

37. A method according to claim 20, wherein the thickness of the dielectric layer is about 20000 Å.

38. A method according to claim 20, wherein the first depth is about 1000–2000 Å.

39. A method according to claim 20, wherein the second depth is about 10000 Å.

40. A method according to claim 20, wherein the third implanting step comprises implanting oxygen gases into the position corresponding to the implanting stop layer so as to transform the implanting stop layer into an incohesive structure.

41. A method according to claim 20, wherein the third implanting step comprises implanting oxygen gases into the position corresponding to the implanting stop layer and performing an annealing step so as to transform the implanting stop layer into an oxide-like structure.

42. A method according to claim 20, wherein parts of the conductive layer and mask layer removing step comprise using a chemical mechanical polishing.

* * * * *